(12) United States Patent
Huang et al.

(10) Patent No.: US 7,901,854 B2
(45) Date of Patent: Mar. 8, 2011

(54) WAFER EDGE EXPOSURE UNIT

(75) Inventors: Po-Chang Huang, Taipei (TW);
Heng-Hsin Liu, Yonghe (TW);
Heng-Jen Lee, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 154 days.

(21) Appl. No.: 12/437,776

(22) Filed: May 8, 2009

(65) Prior Publication Data

US 2010/0285399 A1  Nov. 11, 2010

(51) Int. Cl.
*G03F 9/00* (2006.01)
*G03C 5/00* (2006.01)
*G03B 27/32* (2006.01)
*G03B 27/42* (2006.01)

(52) U.S. Cl. .................. 430/30; 430/311; 430/322; 355/53; 355/67; 355/70; 355/77; 356/399; 356/401

(58) Field of Classification Search .............. 430/30, 430/311, 322; 355/53, 67, 70, 77; 356/399, 356/401
See application file for complete search history.

(56) References Cited

U.S. PATENT DOCUMENTS

| | | | |
|---|---|---|---|
| 5,723,385 A | 3/1998 | Shen et al. | |
| 5,966,628 A | 10/1999 | Wei et al. | |
| 6,089,763 A | 7/2000 | Choi et al. | |
| 6,114,747 A | 9/2000 | Wei et al. | |
| 6,214,441 B1 | 4/2001 | Liu et al. | |
| 6,743,735 B2 | 6/2004 | Chu et al. | |
| 6,875,971 B2 * | 4/2005 | Kim | 250/201.2 |
| 7,573,054 B2 * | 8/2009 | Iwashita et al. | 250/559.36 |
| 2004/0212809 A1 * | 10/2004 | Shim et al. | 356/479 |
| 2006/0055910 A1 | 3/2006 | Lee | |
| 2007/0009815 A1 | 1/2007 | Oh et al. | |
| 2007/0085988 A1 | 4/2007 | Kim | |

* cited by examiner

*Primary Examiner*—Christopher G Young
(74) *Attorney, Agent, or Firm*—Duane Morris LLP; Steven E. Koffs

(57) ABSTRACT

A wafer edge exposure unit comprises a chuck for supporting a wafer. The chuck is rotatable about a central axis. A plurality of light sources are positioned or movably positionable with a common radial distance from the axis of the rotatable chuck, each light source configured to direct exposure light on a respective edge portion of the wafer simultaneously.

20 Claims, 4 Drawing Sheets

WAFER EDGE EXPOSURE UNIT

FIELD OF THE INVENTION

The present disclosure relates to semiconductor fabrication equipment generally, and more specifically to wafer edge exposure units.

BACKGROUND

Semiconductor fabrication involves deposition, patterning and removal of various layers of materials on semiconductor wafers. Frequently, after deposition of a layer, it is necessary to planarize the deposited layer using chemical mechanical polishing (CMP). CMP involves abrasion of the layer with a polishing pad, in the presence of a slurry. Following the completion of the CMP, the slurry debris and contaminants must be removed to avoid contamination of integrated circuit layers. The scribe lines between integrated circuit dies are susceptible to such infiltration. U.S. Pat. No. 6,214,441 (the '441 patent) is incorporated by reference herein in its entirety. The '441 patent describes a method for sealing the circumferential edge of the wafer using a wafer edge exposure unit. A photosensitive material is applied to the wafer, and the edge of the wafer is exposed in a wafer edge exposure (WEE) unit. An edge sealing ring is thus formed, preventing infiltration of contaminants in the scribe lines.

U.S. Pat. No. 5,996,628 (the '628 patent) also discusses application of a WEE unit in a photo process for removing dielectric material from the circumferential edge of the wafer. By removing the edge material, damage to the dielectric layer and propagation of cracks to the wafer interior during handling is prevented.

In a typical configuration, a WEE has an irradiation system including a first light source, a lens for focusing the light, and a mask to limit the light to a small region. The WEE includes a movable rotating chuck for passing the circumference of the wafer under the first light source. The WEE further includes a notch searching unit that includes a second light source and an optical sensor, such as a charge coupled device (CCD) sensor or a CMOS imaging sensor. When a single notch at the wafer's perimeter passes between the second light source and sensor of the notch searching unit, the beginning of a full wafer rotation is noted. When the single notch is again detected by the optical sensor, the wafer has rotated through a complete rotation, and the entire circumferential edge of the wafer has been exposed to the irradiating system light source.

For a given photosensitive material, each part of the wafer edge is given a minimum dose of irradiating light to develop the photosensitive material. For a given light source of fixed intensity, the amount of time needed to expose the entire wafer edge is proportional to the circumference of the wafer. A 50% increase in wafer diameter (e.g., from 300 mm to 450 mm) results in a 50% increase in exposure time. Additionally, the notch searching unit may rotate the wafer by nearly a full rotation to locate the notch. So a 50% increase in wafer diameter also results in about a 50% increase in the notch location time. The increased delay in the WEE can reduce the duty cycle of downstream tools, reducing fabrication facility ("fab") yield and profitability.

SUMMARY OF THE INVENTION

In some embodiments, a wafer edge exposure unit comprises a chuck for supporting a wafer. The chuck is rotatable about a central axis. A plurality of light sources are positioned or movably positionable with a common radial distance from the axis of the rotatable chuck, each light source configured to direct exposure light on a respective edge portion of the wafer simultaneously.

In some embodiments, a wafer edge exposure unit comprises a chuck for supporting a wafer, the chuck being rotatable about a central axis. At least one light source is positioned to direct exposure light on an edge portion of the wafer. A plurality of notch searching units are positioned or movably positionable for detecting a notch proximate the edge portion of the wafer.

In some embodiments, a method comprises rotating a wafer about a central axis. A plurality of non-contiguous edge portions of the rotating wafer are exposed to light from respective light sources to develop a photoresist on the edge portions simultaneously, so as to expose the edge portions to the light continuously throughout an entire circumference of the wafer during less than one complete rotation of the wafer.

DETAILED DESCRIPTION

Figure 1:
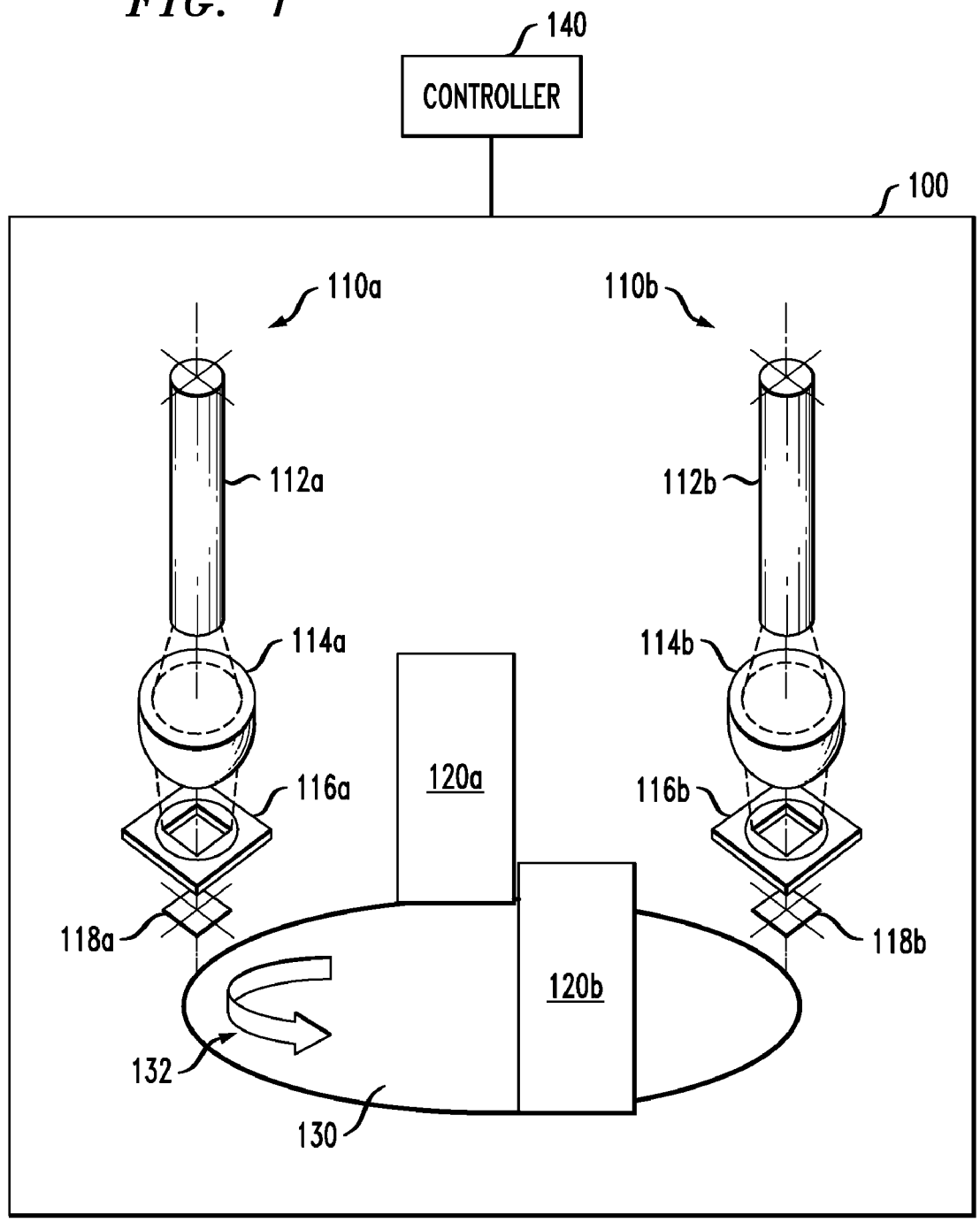
FIG. 1 is a schematic diagram of a WEE, showing two irradiation assemblies.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
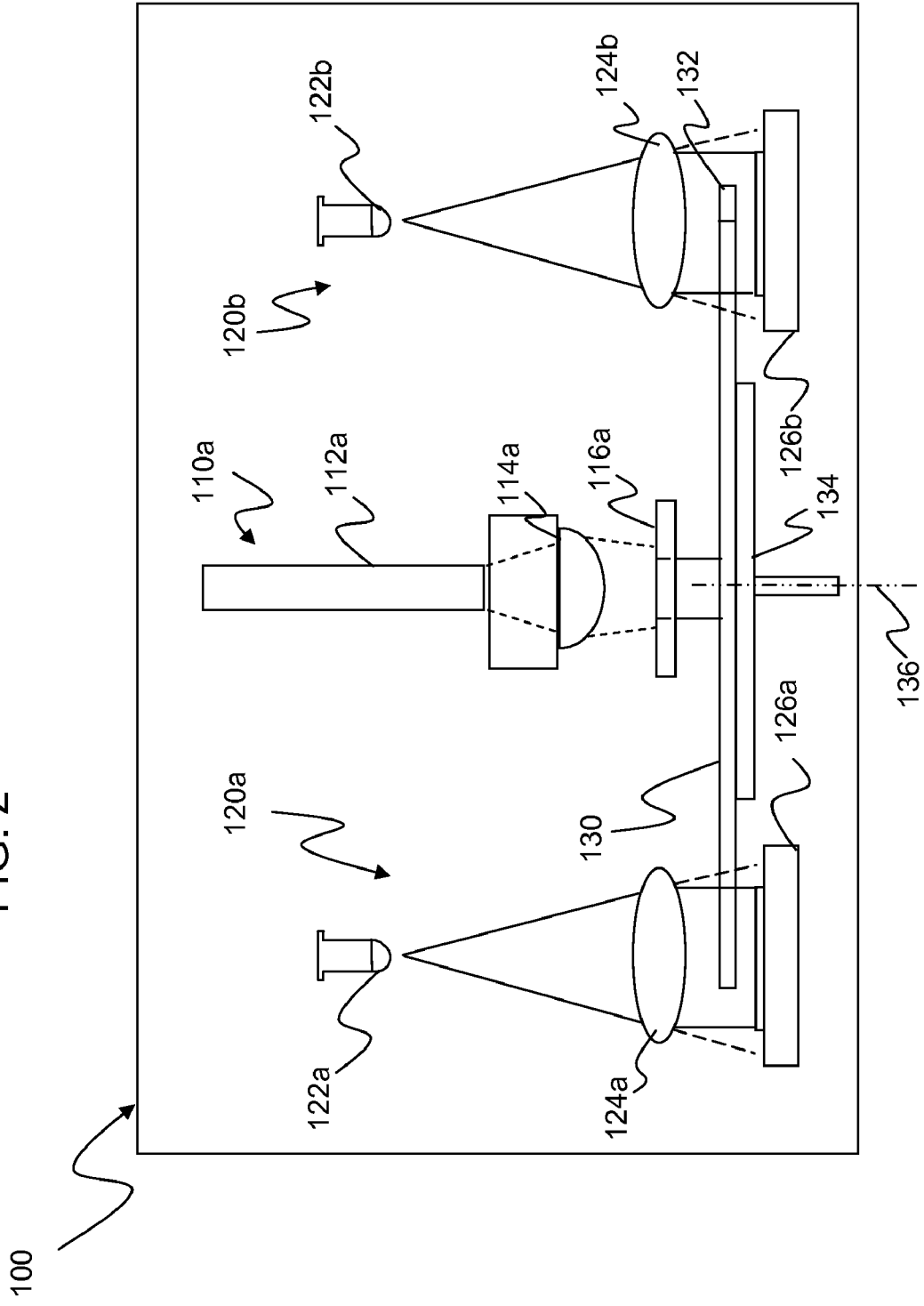
FIG. 2 is a side view of the WEE of FIG. 1, showing two notch searching units.
Figure 3:
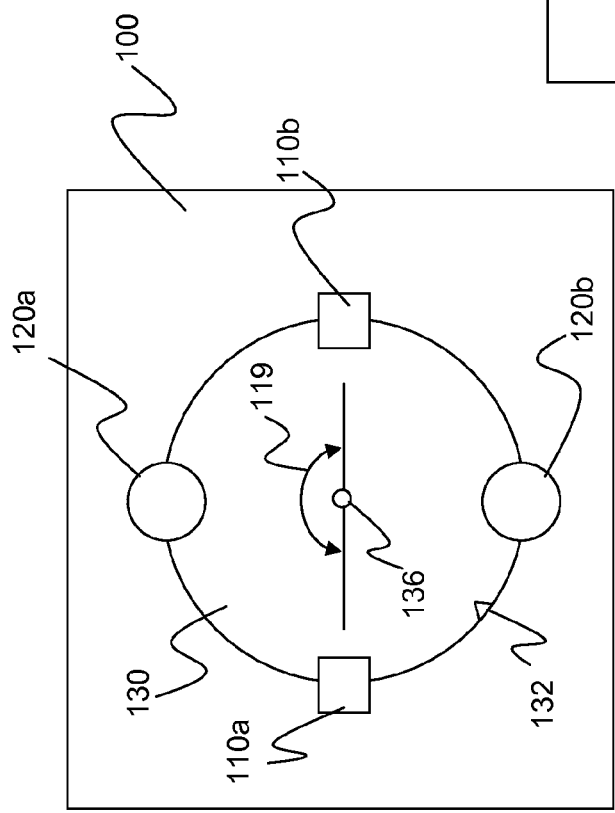
FIG. 3 is a plan view of the WEE of FIG. 1, schematically showing the two irradiation assemblies and the two notch searching units.

FIGS. 1-3 show a wafer edge exposure (WEE) unit 100. FIG. 1 shows two irradiation systems 110a, 110b in perspective, and shows two notch searching units 120a, 120b schematically. FIG. 2 is a side elevation view showing the two notch searching units 120a, 120b, with one of the irradiation systems visible. FIG. 3 is a top plan view schematically showing the WEE of FIG. 1.

WEE unit 100 has a chuck 134 for supporting a wafer 130. The chuck 134 is rotatable about a central axis 136.

A plurality of light sources 110a, 110b are provided. Each light source 110a, 110b is a respective irradiation system positioned or movably positionable with a common radial distance from the axis 136 of the rotatable chuck 134. Each light source 110a, 110b is configured to direct exposure light on a respective edge portion of the wafer simultaneously.

In some embodiments, each irradiation system 110a, 110b includes a respective light emitter 112a, 112b, such as a laser or light emitting diode (LED), a focusing lens 114a, 114b, and an exposure mask 116a, 116b. The exposure mask 116a, 116b permits a shaped exposure light 118a, 118b to impinge on and develop a photosensitive material at the circumferential edge of the wafer 130.

As shown in FIG. 1-3, in some embodiments, the plurality of light sources includes two light sources 110a, 110b positioned or movably positionable directly opposite from each other along a line segment that passes through the axis 136.

Figure 4:
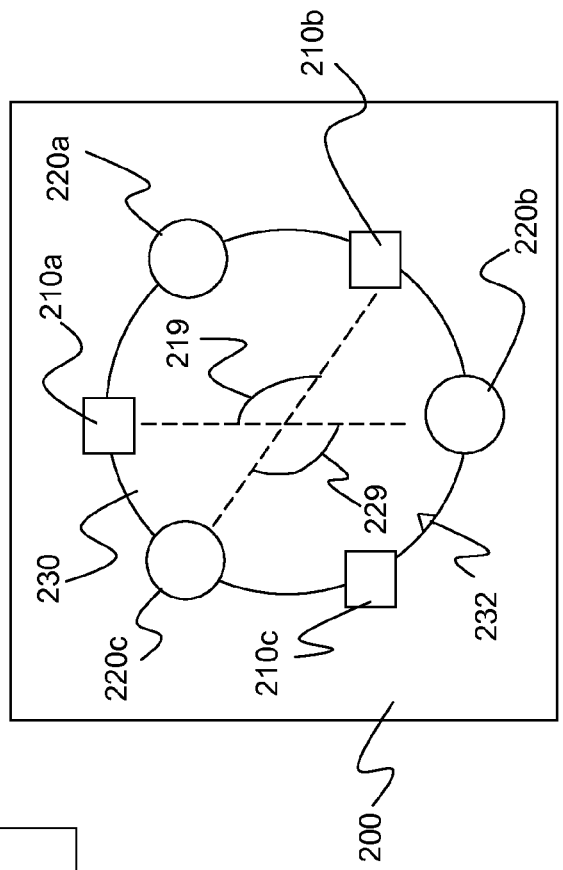
FIG. 4 is a plan view of a WEE having three irradiation assemblies and the three notch searching units.

In other embodiments, WEE 100 may include any integer number of two or more light sources. More generally, the plurality of light sources includes N light sources, where N is an integer greater than one, the N light sources being spaced apart from each other by an angle of 360/N degrees between each pair of successive light sources. Thus, the WEE may include three light sources spaced 120 degrees apart (as shown in FIG. 4), four light sources spaced 90 degrees apart, or any other combination. The optimal number of light sources for a given WEE depends on the size of the wafers to be processed, and the desired total exposure time.

With two light sources 110a, 110b on opposite sides of the wafer 130, each light source exposes a respective semi-circular half of the circumference of the edge of wafer 130, simultaneously. When the wafer 130 has rotated 180 degrees, the entire circumference has been exposed. Without changing the photosensitive material, irradiating light intensity, or rotation speed, the exposure time within the WEE is reduced by 50%.

In some embodiments, the WEE is originally constructed to include two light sources 110a, 110b. In other embodiments, a second light source 110b is retrofitted in a pre-existing WEE.

FIGS. 1-3 also show that WEE 100 includes a plurality of notch searching units 120a, 120b positioned or movably positionable for detecting a notch 132 proximate an edge portion of the wafer 130. For example, in FIGS. 1-3, the plurality of notch searching units include two notch searching units 120a, 120b positioned or movably positionable directly opposite from each other along a line segment that passes through the axis 136.

Each notch searching unit 120a, 120b includes a light source 122a, 122b, a lens 124a, 124b, and a sensor 126a, 126b, which may be a CCD or CMOS imaging sensor. Each notch searching unit may be mounted on a rail and movable by a linear actuator towards or away from the axis 136, to accommodate differently sized wafers. Upon mounting the wafer 130 on the chuck, the notch searching units are actuated towards the axis 136, until the CCD or CMOS imaging sensor detects an edge of the wafer. At that point, the wafer can be rotated until the notch 132 is detected twice, to expose the edge to the light from the light sources 110a, 110b.

Although FIG. 3 shows the notch searching units 120a, 120b evenly spaced at 90 degree intervals from the irradiating units 110a, 110b, this is only an example. The notch searching units 120a, 120b may be positioned closer to, or further from, irradiating units 110a, 110b, so long as the units fit within the WEE housing and do not interfere with each other.

More generally, the plurality of notch searching units may include N notch searching units, where N is any integer greater than one, the N notch searching units being spaced apart from each other by an angle 119 (FIG. 3) or 219 (FIG. 4) of 360/N degrees between each pair of successive notch searching units.

With two notch searching units 120a, 120b the amount of time between notch detections is decreased. The determination of the duration of the exposure of the wafer is based on notch detections by both notch searching units. In the embodiment of FIGS. 1-3, the controller 140 controls the system to expose the wafer edge for a period that includes two consecutive wafer detections, one by each notch searching unit. The controller 140 may be an embedded microprocessor or digital signal processor implemented in application specific integrated circuitry (ASIC), or a networked computer or programmable logic controller.

In a WEE (not shown) having only one notch searching unit, if the notch has just passed the detector when the wafer begins rotating, then the first notch detection does not occur until the wafer has rotated nearly 360 degrees. Then the wafer rotates another 360 degrees before the exposure is considered complete. Thus, with only one notch searching unit, the maximum time for two detections of the notch is nearly two times the rotation period of the wafer. Similarly, the minimum time for two notch detections (when the notch passes the detector immediately after the wafer begins rotating) is slightly more than the rotation period of the wafer.

With two notch searching units 120a, 120b, as shown in FIGS. 1-3, if the notch 132 has just passed the detector 126a when the wafer 130 begins rotating, then the first notch detection does not occur until the wafer 130 has rotated nearly 180 degrees. Then the wafer rotates another 180 degrees before the exposure is considered complete. Thus, the maximum time for two detections of notch 132 is reduced to less than one rotation period of the wafer. Similarly, the minimum time for two notch detections (when the notch passes the detector 126a immediately after the wafer 130 begins rotating) is slightly more than one half the rotation period of the wafer 130. For larger wafers, the reduction in total WEE time of about one rotation period is a significant time savings that may improve the duty cycle of the downstream equipment.

With two notch detection units 120a, 120b, the controller 140 controls the duration of the wafer edge exposure process, so as to include detections of the notch by each of the two notch searching units 120a, 120b. More generally, with N notch detection units, the controller 140 controls the duration of the wafer edge exposure process, so as to include detections of the notch by two successive ones of the N notch searching units. The controller 140 controls the duration to be shorter than a period of three successive detections of the notch by three successive ones of N evenly spaced notch searching units. Further, it is not necessary to wait for any single one of the notch detection units to make a second detection by the same notch detection unit to complete the exposure of the wafer.

FIG. 4 is a schematic plan view of a WEE 200 having three light sources 210a-210c and three notch searching units 220a-220c. The light sources 210a-210c are separated from each other by an angle 219 that is 360/3 or 120 degrees between successive light sources. The notch searching units 220a-220c are separated from each other by an angle 229 that is 360/3 or 120 degrees between successive notch searching units. In FIG. 4, the notch searching units 220a-220c are evenly spaced between successive light sources 210a-210c, but this is not a requirement, so long as the light sources 210a-210c and notch searching units 220a-220c do not interfere with each other. As the wafer 230 rotates, the circumferential edge of the wafer is exposed at three locations 120 degrees apart, sweeping out three exposed sections which meet after the wafer has rotated 120 degrees.

With three light sources 210a-210c and three notch searching units 220a-220c, as shown in FIG. 4, the maximum amount of time required for seeking the notch and exposing the entire circumference of the wafer 230 is reduced to ⅔ of the period of rotation of the wafer. Thus, if the search for the notch begins immediately after the notch passes notch searching unit 220*a*, then nearly ⅓ of one period later, the notch will be detected by notch searching unit 220*b*, and another ⅓ of one period later, when the notch is detected by notch searching unit 220*c*, the entire circumference of the wafer 230 has been exposed to the light from light sources 210*a*-210*c*. The minimum time is similarly reduced. Thus, if the search for the notch begins immediately before the notch passes notch searching unit 220*a*, then nearly ⅓ of one period later, when the notch is detected by notch searching unit 220*b*, the entire circumference of the wafer 230 has been exposed to the light from light sources 210*a*-210*c*. So the minimum time for detecting notch 232 and exposing the entire circumference of the edge is slightly more than ⅓ of one rotation of the wafer 230.

With three light sources 210*a*, 210*b* spaced 120 degrees apart, each light source exposes a respective 120 degree arc of the circumference of the edge of wafer 230, simultaneously. When the wafer 230 has rotated 120 degrees, the entire circumference has been exposed. Without changing the photosensitive material, irradiating light intensity, or rotation speed, the exposure time within the WEE is reduced by 66%.

The examples of FIG. 3 and FIG. 4 are not limiting, and other numbers N of light sources and notch searching units may be used.

Figure 5:
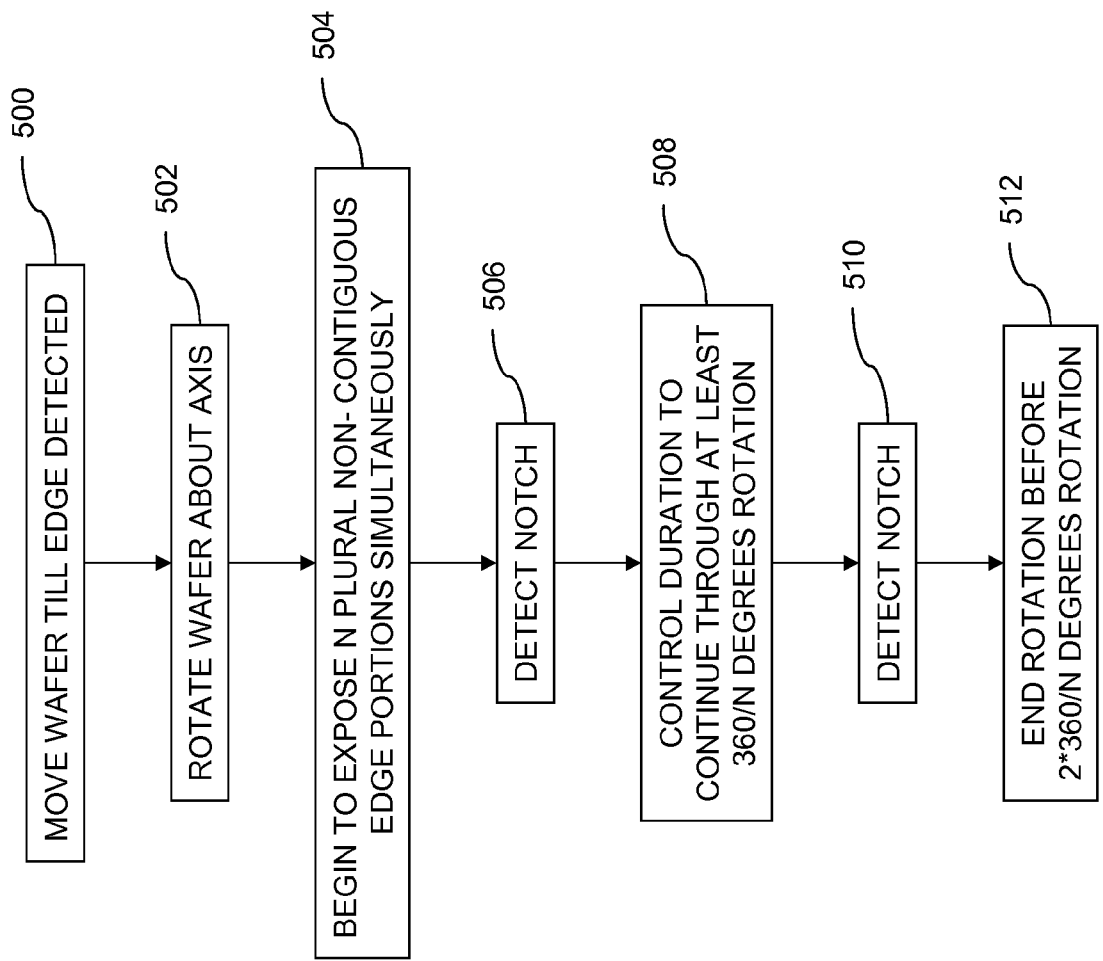
FIG. 5 is a flow chart of a method for exposing an edge of a wafer in a WEE.

FIG. 5 is a flow chart of an exemplary method for exposing the edge of a wafer.

At step 500, the wafer is moved (or the edge detection units are moved), until the imaging devices of the notch searching units detect the edges of the wafer.

At step 502, the wafer is rotated about a central axis.

At step 504, the irradiating light sources are turned on, to begin exposing N plural non-contiguous edge portions of the rotating wafer to light from respective light sources to develop a photoresist on the edge portions simultaneously.

At step 506, the notch is detected by a first one of the notch searching units.

At step 508, the controller controls the duration so as to expose N edge portions to the light continuously throughout an entire circumference of the wafer during less than one complete rotation of the wafer.

At step 510, the notch at a periphery of the wafer is detected by a second successive one of N evenly spaced notch searching units.

At step 512, the controller controls the duration of the exposing to conclude after detection of the notch by the second of the N notch searching units. The total amount of rotation by the wafer, from the time when the search for the first notch begins until completion of the exposure of the entire circumference, is less than 2*N/360. Once the notch is detected by a first one of the notch searching units, the edge portions are exposed to the light continuously throughout the entire circumference of the wafer during a time T/N, where T is a period of rotation of the wafer. At the end of time T/N, the second edge detection occurs.

Although embodiments are described above having plural irradiation systems 110*a*, 110*b* and plural notch searching units 120*a*, 120*b*, an alternative WEE system (not shown) has at least two irradiation systems 110*a*, 110*b*, and a rotation angle sensor. The controller 140 detects an initial absolute rotation angle of the chuck 134. Given the number N of irradiating units, the controller 140 determines the angle (360/N) through which the wafer must rotate to complete exposure of the entire circumference. When the rotation angle sensor detects rotation of the wafer through the determined angle, then exposure is completed.

Although embodiments are described above having plural irradiation systems 110*a*, 110*b* and plural notch searching units 120*a*, 120*b*, one of ordinary skill in the art may select an alternative system (not shown) having two notch searching unit 120*a*, 120*b*, and a single irradiation system. Even with a single irradiating system, the addition of a notch searching unit 120*b* reduces the average and maximum amounts of time it takes for the first notch detection to occur. The maximum time to make the first detection (when the rotation begins immediately after the notch 132 passes one of the notch searching units) is decreased from nearly one rotation period of the wafer to nearly one half rotation period of the wafer. Thus, a total time in the WEE can be reduced by about one half of the rotation period, and the duty cycle of downstream tools may still be improved.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A wafer edge exposure unit, comprising:
   a chuck for supporting a wafer, the chuck being rotatable about a central axis;
   a plurality of light sources positioned or movably positionable with a common radial distance from the axis of the rotatable chuck, each light source configured to direct exposure light on a respective edge portion of the wafer simultaneously.

2. The wafer edge exposure unit of claim 1, wherein the plurality of light sources includes two light sources positioned or movably positionable directly opposite from each other along a line segment that passes through the axis.

3. The wafer edge exposure unit of claim 1, wherein the plurality of light sources includes N light sources, where N is an integer greater than one, the N light sources being spaced apart from each other by an angle of approximately 360/N degrees between each pair of successive light sources.

4. The wafer edge exposure unit of claim 1, further comprising:
   a plurality of notch searching units positioned or movably positionable for detecting a notch proximate an edge portion of the wafer.

5. The wafer edge exposure unit of claim 4, wherein the plurality of notch searching units includes two notch searching units positioned or movably positionable directly opposite from each other along a line segment that passes through the axis.

6. The wafer edge exposure unit of claim 4, wherein the plurality of notch searching units includes N notch searching units, where N is an integer greater than one, the N notch searching units being spaced apart from each other by an angle of 360/N degrees between each pair of successive notch searching units.

7. The wafer edge exposure unit of claim 6, further comprising a controller for controlling a duration of the wafer edge exposure process, so as to include detections of the notch by at least two successive ones of the plurality of notch searching units.

8. The wafer edge exposure unit of claim 1, wherein:
   the plurality of light sources includes N light sources, where N is an integer greater than one, the N light sources being spaced apart from each other by an angle of 360/N degrees between each pair of successive light sources, and the wafer edge exposure unit further comprises N notch searching units positioned or movably positionable for detecting a notch proximate an edge portion of the wafer, the N notch searching units being spaced apart from each other by an angle of 360/N degrees between each pair of successive notch searching units.

9. The wafer edge exposure unit of claim 8, further comprising a controller for controlling a duration of the wafer edge exposure process, so as to include detections of the notch by at least two successive ones of the plurality of notch searching units.

10. A wafer edge exposure unit, comprising:
a chuck for supporting a wafer, the chuck being rotatable about a central axis;
at least one light source positioned to direct exposure light on an edge portion of the wafer; and
a plurality of notch searching units positioned or movably positionable for detecting a notch proximate the edge portion of the wafer.

11. The wafer edge exposure unit of claim 10, wherein the plurality of notch searching units includes N notch searching units, where N is an integer greater than one, the N notch searching units being spaced apart from each other by an angle of 360/N degrees between each pair of successive notch searching units.

12. The wafer edge exposure unit of claim 11, further comprising a controller for controlling a duration of the wafer edge exposure process, so as to include detections of the notch by two of the N notch searching units.

13. The wafer edge exposure unit of claim 11, wherein
the at least one light source includes N light sources positioned or movably positionable with a common radial distance from the axis of the rotatable chuck, the N light sources spaced apart from each other by an angle of 360/N degrees between each pair of successive light sources, and
the wafer edge exposure unit further comprises a controller for controlling a duration of the wafer edge exposure process, so as to include detections of the notch by at least two of the notch searching units.

14. A method comprising:
rotating a wafer about a central axis;
exposing a plurality of non-contiguous edge portions of the rotating wafer to light from respective light sources to develop a photoresist on the edge portions simultaneously, so as to expose the edge portions to the light continuously throughout an entire circumference of the wafer during less than one complete rotation of the wafer.

15. The method of claim 14, wherein the exposing step includes:
exposing two edge portions simultaneously using two respective light sources, and
exposing the edge portions to the light continuously throughout the entire circumference of the wafer during one half of one rotation of the wafer.

16. The method of claim 14, wherein the exposing step includes:
exposing N edge portions simultaneously using N respective light sources, were N is an integer greater than one, so that the edge portions are exposed to the light continuously throughout the entire circumference of the wafer during a time T/N, where T is a period of rotation of the wafer.

17. The method of claim 16, further comprising:
detecting a notch at a periphery of the wafer using at least two successive ones of N evenly spaced notch searching units, and
controlling a duration of the exposing to include detection of the at least two of the N notch searching units.

18. The method of claim 17, wherein the controlling includes controlling the duration to be shorter than a period of three successive detections of the notch by three successive ones of N evenly spaced notch searching units.

19. The method of claim 18, wherein N equals 3.

20. The method of claim 16, wherein N equals 3.

* * * * *